US006867492B2

United States Patent
Auburger et al.

(10) Patent No.: US 6,867,492 B2
(45) Date of Patent: Mar. 15, 2005

(54) RADIO-FREQUENCY POWER COMPONENT, RADIO-FREQUENCY POWER MODULE, METHOD FOR PRODUCING A RADIO-FREQUENCY POWER COMPONENT, AND METHOD FOR PRODUCING A RADIO-FREQUENCY POWER MODULE

(75) Inventors: Albert Auburger, Regenstauf (DE); Frank Klose, Pentling (DE); Rudolf Lehner, Laaber (DE); Horst Theuss, Wenzenbach (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/347,539

(22) Filed: Jan. 17, 2003

(65) Prior Publication Data

US 2003/0155661 A1 Aug. 21, 2003

(30) Foreign Application Priority Data

Jan. 17, 2002 (DE) .......................... 102 01 781

(51) Int. Cl.[7] .................. H01L 23/10; H01L 23/34
(52) U.S. Cl. .............. 257/706; 257/712; 257/675; 257/778
(58) Field of Search ................ 257/704, 706–707, 257/711, 712, 675, 778, 731, 717–722, 796, 787, 737–738, 780, 781

(56) References Cited

U.S. PATENT DOCUMENTS

| 5,382,827 | A | * | 1/1995 | Wang et al. |
| 5,616,957 | A | | 4/1997 | Kajihara |
| 5,933,709 | A | | 8/1999 | Chun |
| 6,169,421 | B1 | * | 1/2001 | Bryan et al. ............. 326/83 |
| 6,184,580 | B1 | | 2/2001 | Lin |
| 6,268,239 | B1 | * | 7/2001 | Ikeda |
| 6,400,035 | B1 | * | 6/2002 | Hirata et al. |

FOREIGN PATENT DOCUMENTS

| JP | 05166980 A | 7/1993 |
| JP | 2000031352 A | 1/2000 |
| JP | 2000223629 | 8/2000 |

* cited by examiner

Primary Examiner—Long Pham
Assistant Examiner—Dilinh Nguyen
(74) Attorney, Agent, or Firm—Laurence A. Greenberg; Werner H. Stemer; Ralph E. Locher

(57) ABSTRACT

A radio-frequency power component and a radio-frequency power module, as well as to methods for producing them are encompassed. The radio-frequency power component has a semiconductor chip that is suitable for flip chip mounting. The semiconductor chip has an active upper face that produces power losses. This active upper face is covered by an electrically isolating layer leaving free contact surfaces, with a heat-dissipating metal layer being applied to its upper face. The metal layer directly dissipates the heat losses from the active semiconductor structures.

10 Claims, 10 Drawing Sheets

RADIO-FREQUENCY POWER COMPONENT, RADIO-FREQUENCY POWER MODULE, METHOD FOR PRODUCING A RADIO-FREQUENCY POWER COMPONENT, AND METHOD FOR PRODUCING A RADIO-FREQUENCY POWER MODULE

BACKGROUND OF THE INVENTION

Field of the Invention

The invention relates to a radio-frequency power component and to a radio-frequency current module, as well as to methods for producing such components and modules.

Radio-frequency power components have a semiconductor chip. The semiconductor chip may have on its active upper face radio-frequency power diodes, radio-frequency power amplifiers, and integrated circuits for driving them. The semiconductor chip has bonding wires that to some extent change the input impedance as well as the output impedance and which do not allow active cooling of the active upper face of the semiconductor chip, so that the power loss from the radio-frequency power component must be dissipated via the passive rear face of the semiconductor chip. Such radio-frequency power components thus have both electrical and thermal disadvantages.

SUMMARY OF THE INVENTION

It is accordingly an object of the invention to provide a radio-frequency power component, a radio-frequency power module, a method for producing a radio-frequency power component, and a method for producing a radio-frequency power module that overcome the hereinafore-mentioned disadvantages of the heretofore-known devices of this general type and that avoid the disadvantages of radio-frequency power components and of radio-frequency power modules and specify a radio-frequency power component and a radio-frequency power module, whose input and output impedances are not dominated by connection techniques and that allow more intensive thermal cooling of the active upper face of the semiconductor chip. A further object is to provide methods for producing the power component and module.

According to the invention, the radio-frequency power module has a semiconductor chip with an active upper face that produces power losses and with a passive rear face for flip chip mounting. The upper face of the semiconductor chip has an electrically isolating layer. This electrically isolating layer covers the active semiconductor structures. However, contact surfaces with external contacts that are configured using a defined grid size remain free of the electrically isolating layer. The upper face of the isolating layer also has a heat-dissipating metal layer that is electrically isolated from the active semiconductor structures.

This radio-frequency power component has the advantage that the semiconductor structures that produce heat losses can be cooled directly via the metal layer that dissipates heat although it is electrically isolated. Such a metal layer of macroscopic size on the active semiconductor structures that produce heat losses furthermore has the advantage that the radio-frequency power component can be mounted in a mechanically robust manner on a circuit mount. The microscopically small external contacts on the microscopically small contact surfaces on the semiconductor chip are in this case not covered by the metal layer and can be connected to a circuit mount, disposed above, without any fluctuations in the input or output impedance. In this context, the expression microscopically small should be understood as meaning an order of magnitude which can be measured only using an optical microscope, while the expression macroscopically large dimensions should be understood as meaning that these can be identified and measured with the naked eye.

The macroscopically large metal layer may have a coating that corresponds to the material of the microscopically small external contacts. This has the advantage that both the macroscopically large metal layer and the microscopically small external contacts can be applied in one process step, and not only for an individual power component or for an individual semiconductor chip, but at the same time for a large number of semiconductor chips in a semiconductor wafer.

Consequently, no additional production step is required to apply a large-area or macroscopically large thermally conductive contact to the active semiconductor structures, instead, such a large-area or macroscopically large thermally conductive contact can be produced at the same time as the microscopically small external contacts for flip chip mounting. While the microscopically small external contacts are in the form of solder balls or solder studs, the large-area thermally conductive contact is in the form of a solder layer. Such a solder layer may be formed from a silver solder material. The large-area, thermally-conductive contact on the metal layer at the same time protects the microscopically small external contacts against mechanical damage during transport and installation of the radio-frequency power component. This improves the storage capability for the radio-frequency power component.

The active semiconductor structures that produce power losses on the active upper face of the semiconductor chip may have a large number of metal oxide field-effect transistors connected in parallel. In this case, a common gate contact for all the metal oxide field-effect transistors forms an input electrode for the radio-frequency power component. A common drain contact analogously forms the output electrode of the radio-frequency power component, and the heat-dissipating metal layer covers all the large number of metal oxide field-effect transistors. The large number of metal oxide field-effect transistors that are connected in parallel, on the one hand, result in a high power density while, on the other hand, the parallel connection results in a high cut-off frequency, with each metal oxide field-effect transistor intrinsically having an extremely short field-effect transistor channel length in the sub-micrometer range.

A further aspect of the invention relates to a radio-frequency power module having a radio-frequency power component as is described above. The radio-frequency power component in the radio-frequency power module is disposed on a cooling plate. This cooling plate is used as a circuit or system mount and has a cold cap. The size of the upper face of the cold cap is matched to the size of the heat-dissipating metal layer of the radio-frequency power component. The cold cap on the cooling plate is surrounded by an isolation layer with a conductor track plane. The conductor track plane has contact connecting surfaces using the same grid size as the contact surfaces on the radio-frequency power component. The radio-frequency power component is disposed with its external contacts on the contact connecting surfaces of the conductor track plane, and is connected by its large-area thermally conductive contact to the upper face of the cold cap.

This radio-frequency power module has the advantage that its active semiconductor structure is cooled intensively in the area in which the heat losses are produced. Furthermore, the radio-frequency power module has the advantage that variations in the input impedance and in the output impedance are minimized, because there are no bonding wire loops connecting the contact surfaces of the semiconductor chip to contact connecting surfaces on the conductor track plane, but flip chip contacts that geometrically comply with a precisely defined grid size and do not form any inductively acting different wire loops. In fact, the input impedance and/or the output impedance of the radio-frequency power component can be matched to the respective application by using appropriate passive surface-mounted components in the radio-frequency power module. Such impedance matching has the advantage that it can be calculated in advance and can be used in a defined manner.

Furthermore, the radio-frequency power module may have passive printed components for impedance matching to the input and/or to the output of the radio-frequency power component. These passive printed components can be disposed in the conductor track plane. Printed components such as these are used for impedance matching when minor changes are required in the inductance or in the capacitance. The radio-frequency power module thus has passive surface-mounted components for when large inductance or capacitance values are required for impedance matching.

As the isolation layer with a conductor track plane, the radio-frequency power module may have a printed circuit board that has an opening that is matched to the cold cap on the cooling plate. The cold cap then projects through this opening and is thermally-conductively connected via the thermally-conductive contact to the heat-dissipating metal layer of the radio-frequency power component. This modular technique has the advantage that a printed circuit board can be prepared relatively easily, separately from the cooling plate production and the application of the cold cap to the cooling plate, with the two components being joined together only in a final assembly step, by pushing the cold cap through the matched opening which is provided in the printed circuit board. In this case, the external circumference of the cold cap can be constructed such that it is at the same time coded so that it can be fitted only in the correct alignment to the printed circuit board.

As the thermally conductive contact, the radio-frequency power component may have a solder layer that is disposed in the radio-frequency power module, between the heat-dissipating metal layer of the radio-frequency power component and the cold cap on the cooling plate. A solder layer such as this has the advantage that it can correspond to the material of the external contacts of the radio-frequency power components, so that both the thermally conductive contact and the electrically conductive external contacts can be connected to the further components of the radio-frequency power module in one process step.

Instead of the thermally conductive solder layer or the thermally conductive contact, the radio-frequency power module may have a thermally conductive adhesive layer with thermally conductive particles between the heat-dissipating metal layer and the cold cap on the cooling plate. Particles such as these may be composed of thermally conductive aluminum, copper, silver, gold, silicon oxide, boron nitride, aluminum nitride or mixtures of them. A thermally conductive adhesive layer such as this has the advantage that its thickness can be matched to the order of magnitude of the external contacts of the radio-frequency power component in a state before it is crosslinked, and its crosslinking process to form a stable adhesive joint may be delayed until after the external contacts have been connected to the contact connecting surfaces on the conductive track plane.

With the objects of the invention in view, there is also provided a method for producing radio-frequency power components may have the following method steps.

A semiconductor wafer is first of all provided, with a large number of radio-frequency power components that have MOS field-effect transistors that are connected in parallel. Next, the uppermost metallization layer on the active upper face of the semiconductor wafer is then structured in such a way that microscopically small contact surfaces are provided for each radio-frequency power component in the edge areas of each radio-frequency power component, using a predetermined grid size. In addition, a centrally-located, macroscopically-large metal layer is disposed in the center of each radio-frequency power component, leaving free the contact surfaces and such that it is electrically isolated from the active upper face of the semiconductor wafer. Electrical external contacts can then be applied to the contact surfaces, and a large-area thermally conductive contact can be applied to the centrally disposed metal layer. As the final step, the semiconductor wafer is just separated into a large number of radio-frequency power components. Radio-frequency power components such as these can then be stored in order to manufacture corresponding radio-frequency power modules.

This method has the advantage that both the electrically conductive external contacts of the radio-frequency power component for flip chip mounting as well as a macroscopic thermally conductive contact for a large number of radio-frequency power components can be produced in a single process step on one wafer. The macroscopically large metal layer, whose size corresponds to the thermally conductive contact, can be produced at the same time as the microscopically small contact surfaces on the entire semiconductor wafer for a large number of radio-frequency power components. No additional steps are therefore required for the production of the radio-frequency power component according to the invention in order to provide intensive cooling for the active upper face of the radio-frequency power components and to create stable impedance conditions at the input and at the output. The method for producing radio-frequency power components thus remains cost-effective and does not include any additional process risks, so that it can be carried out simply by changing the mask sets for such radio-frequency power components.

Before a central macroscopically large metal layer is applied, an electrically isolating layer of at least an appropriate size for each radio-frequency power component can be applied to an active upper face of the semiconductor wafer. This additional electrically isolating layer is not required when the active semiconductor structure and the associated method steps provide a passivation layer leaving free the contact surfaces on the semiconductor wafer. A passivation layer such as this, which at the same time represents an electrically isolating layer, may be composed of silicon dioxide or silicon nitride. Such application of an additionally electrically isolating layer of appropriate size on the central macroscopic metal layer will be required only if the thickness of the passivation layer is not sufficient to prevent electrical flashovers.

The semiconductor wafer can be separated into a large number of semiconductor chips and hence into a large number of radio-frequency power components as soon as the central macroscopically large metal layer has been applied. In this case, each individual power component must then be provided with appropriate external contacts and an appropriate thermally conductive contact, unless suitable electrically anisotropically conductive adhesive layers are provided for the connection to a circuit mount or to a conductor track plane. This is because, if an electrically anisotropically conductive adhesive is used, there is no need to fit external contacts or to fit a thermally conductive contact, since the characteristics of the electrically anisotropically conductive adhesive produce a selective mutually isolated connection between contact surfaces and contact connecting surfaces on a circuit mount and between central heat-dissipating metal layer and the cold cap on the system mount, with the cooling plate with the isolation layer and conductor track plane resting on it in this case acts as a circuit or system mount.

A method for producing a radio-frequency power module has the following method steps. First of all, a cooling plate composed of metal is provided as the circuit mount or system mount. A mask is then applied to this cooling plate. The cooling plate has openings for electrochemical deposition of metallic cold caps through the opening. The cooling plate and the mask can be dimensioned such that a number of cold caps can be produced simultaneously for a corresponding number of radio-frequency power modules. An isolation layer is then applied to the cooling plate, leaving free the cold cap or the cold caps. This application of the isolation layer may be carried out by spraying or spinning-on, in which case the cold caps may be exposed by selectively dissolving the isolation layer in the area of the cold caps. A conductor track structure with conductor tracks and preferably with printed passive components is then applied, for impedance matching of the input and/or of the output of a radio-frequency power module and/or with contact connecting surfaces for mounting a radio-frequency power component using flip chip technology on the isolation layer. This application of a conductor track structure may be carried out by applying a closed metal layer, with subsequent structuring by using a photoresist and etching step. Once a system mount or a circuit mount has been produced in this way in the form of a cooling plate with a cap and with a surrounding conductor track plane, a radio-frequency power component is applied to each cap using flip chip technology, with the contact connecting surfaces being connected to external contacts of the radio-frequency power component, and with the cold cap at the same time being connected to a heat-dissipating metal layer of the radio-frequency power component via a large-area heat-dissipating contact. External flat conductors are then fitted to conductor tracks of the conductor track structure of the radio-frequency power module and, finally, the components of the radio-frequency power module that have been connected to one another in this way are packed in a plastic packing compound or under a preformed pack cap.

A method such as this has the advantage that not only are the external contacts of the radio-frequency power component fitted using flip chip technology on the circuit mount or on a system mount, but a large-area thermally conductive contact is at the same time thermally conductively connected to a corresponding cold cap. Furthermore, this method provides the capability to electrochemically deposit a number of cold caps at the same time on a large metallic plate, thus making it possible to produce a number of radio-frequency power modules at the same time using a cost-effective parallel process.

The application of the mask in preparation for the electrochemical deposition of cold caps on a metal plate can be carried out by using a photoresist technique. This technique has the advantage that the contour of the cold cap can be structured as required, so that a plug code can be provided, for example for fitting a printed circuit board to a correspondingly matched opening.

A mask can also be applied by using a printing technique, for which purposes a screen printing technique or a stencil printing technique may be used. In the printing technique, only that surface on which the metal cap or cold cap is intended to be deposited is not provided with an electrically passivating layer, so that a mask is produced which allows growth of corresponding metallic cold caps in an electrochemical bath.

Furthermore, the application of an isolating layer and the application of a conductor track structure can be carried out by providing and applying a printed circuit board, which is prepared in advance, with a correspondingly large opening for the cold cap. This method variant has the advantage that the printed circuit board can be structured separately and can be connected to the cooling plate and to the cold cap by using a simple assembly process to form a system mount or circuit mount.

At the same time, the electrically conductive external contacts of the power component can be soldered to the contact connecting surfaces of the conductor track structure and of the cold cap of the cooling plate to a thermally conductive metal layer of the radio-frequency power component, via a large-area thermally conductive contact. The soldering technique has the advantage that not only the external contacts of the radio-frequency power component but also the thermally conductive contact can be connected at the same time to the correspondingly provided structures on the circuit mount or system mount, while on the other hand combinations of a soldering technique and an adhesive bonding technique are also possible, as well as adhesive bonding using an electrically anisotropically acting adhesive, which means that there is no need either for external contacts or for a thermally conductive contact, and the surfaces which are provided on the radio-frequency power component can be connected directly and selectively to the surfaces which are provided on the circuit mount or system mount including the cooling plate, cap, and isolated conductor track structure.

In summary, it can be stated that the present invention provides a cost-effective implementation for high-power radio-frequency power components and radio-frequency power modules with impedance matching using flip chip technology. This cost-effective implementation is used, for example, in base stations for mobile radios. This avoids the use of the established wire bonding technologies, in which different inductances and impedances are produced by the insulation of bonding wires. The radio-frequency power component and the radio-frequency power module according to the invention adopt new approaches to the implementation of amplifier chips, with radio-frequency power amplifiers being implemented essentially on the basis of MOS field-effect transistors using a flip chip construction. Furthermore, a thermally conductive contact is provided as an enlarged contact surface on the semiconductor chip in order to improve the cooling of the active semiconductor structures, thus allowing intensive cooling. Furthermore, the invention concept allows impedance matching in the form of inductances and capacitances to be carried out not only in the form of surface-mounted components but also in the form of integrated passive structures on the printed circuit board plane. In summary, this results in the following advantages for the present invention:

very small component sizes without wire bonds, implementation of defined inductances and hence avoidance of different wire bonding loops with a different inductive effect, increase in the reliability both of the radio-frequency power component and of the radio-frequency power module, heat dissipation directly from the active chip surface through the enlarged heat-dissipating metal layer on the chip, cost-effective production options, integration option for passive printed or surface-mounted structures for impedance matching and for providing filters with appropriate radio-frequency filter characteristics, and cost-effective packing by sheathing with a plastic packing compound or by accommodation under a pack cover, in which case the plastic packing can be produced by extrusion coating or encapsulation in a plastic compound, while the accommodation in a pack cover can be implemented, for example, by covering it with a metal cover.

Other features that are considered as characteristic for the invention are set forth in the appended claims.

Although the invention is illustrated and described herein as embodied in a radio-frequency power component, a radio-frequency power module, a method for producing a radio-frequency power component, and a method for producing a radio-frequency power module, it is nevertheless not intended to be limited to the details shown, because various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

Figure 1:
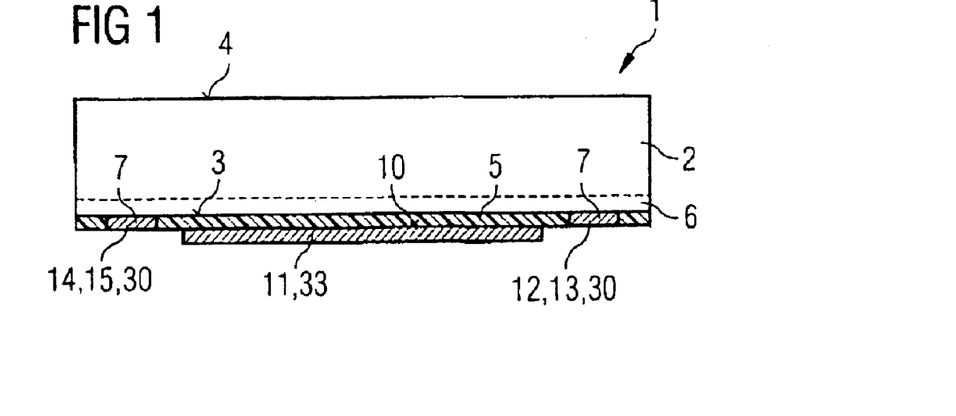
FIG. 1 is diagrammatic sectional view through a first embodiment of a radio-frequency power component according to the invention.

Referring now to the figures of the drawings in detail and first, particularly to FIG. 1 thereof, there is shown a schematic cross section through a first embodiment of a radio-frequency power component 1 according to the invention.

The reference symbol 2 denotes a semiconductor chip with an active upper face 3 and a passive rear face 4, with active semiconductor structures 6 being disposed on the active upper face 3 and, in the case of a radio-frequency power component 1, essentially includes radio-frequency power transistors and radio-frequency power diodes. In the present embodiment, the active semiconductor structure 6, which produce power losses, on the active upper face 3 of the semiconductor chip 2 has a large number of metal oxide field-effect transistors which are connected in parallel, whose common gate contact 12 forms the input electrode 13 of the radio-frequency power component 1, and whose common drain contact 14 forms the output electrode of the radio-frequency power component 1.

The active semiconductor structures 6, which produce power losses on the active upper face 3 of the semiconductor chip 2, are covered by an electrically isolating layer 5. The isolating layer 5 leaves free contact surfaces on the active upper face 3 of the semiconductor chip 2, which are electrically connected via conductor tracks, which are not shown, to electrodes of the active semiconductor structures 6. In addition to the contact surfaces, a thermally conductive metal layer 11, which is electrically isolated from the active semiconductor structures 6, is disposed on the upper face 10 of the isolating layer 5.

While the contact surfaces have microscopically small dimensions, that is to say they have surface area dimensions that can be measured only by using an optical microscope, the heat-dissipating metal layer 11 is of a macroscopic size, that is to say it can be identified and measured with the naked eye. With the aid of this heat-dissipating metal layer 11, which is electrically isolated from the upper face 3, directly on the active semiconductor structures and separated from them only by the thin electrically isolating layer 5, the heat losses from the radio-frequency power component can be emitted directly to the environment or to cooling elements and/or heat sinks.

Figure 2:
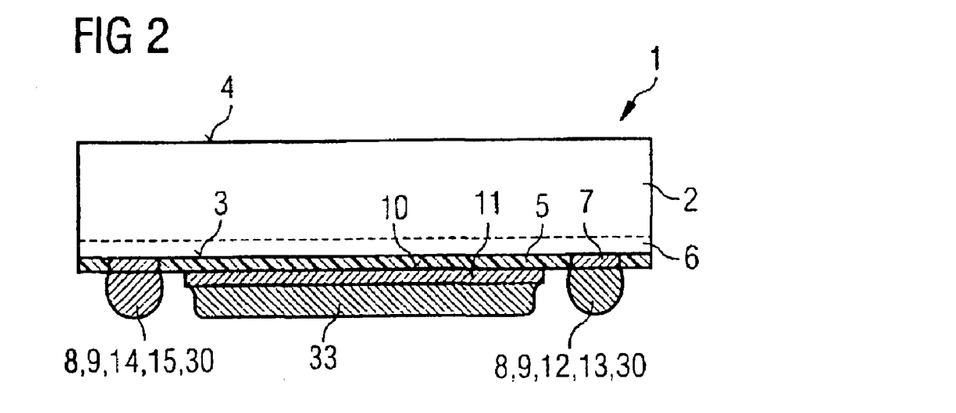
FIG. 2 is a sectional view through a second embodiment of a radio-frequency power component.

FIG. 2 shows a schematic cross section through a second embodiment of a radio-frequency power component 1 according to the invention. Components with the same function as in FIG. 1 are identified by the same reference symbols and will not be explained additionally.

The second embodiment differs from the first embodiment in that external contacts 30 are disposed on the contact surfaces 7 and a thermally conductive contact is provided on the heat-dissipating metal layer 11. This thermally conductive contact 33, which has a large area in comparison to the microscopically small external contacts 30, may be produced from the same material as the external contacts 30 which, in the second embodiment of the invention, are in the form of solder balls 9 or solder studs 8. The solder balls 9 or solder studs 8 in this embodiment shown in FIG. 2 are formed from a silver solder alloy. The structure and the configuration of the external contacts and of the thermally conductive contact 33 allow the radio-frequency power component to be applied directly onto a higher circuit mount or system mount using flip chip technology, and to be electrically and thermally connected to this circuit mount or system mount.

Figure 3:
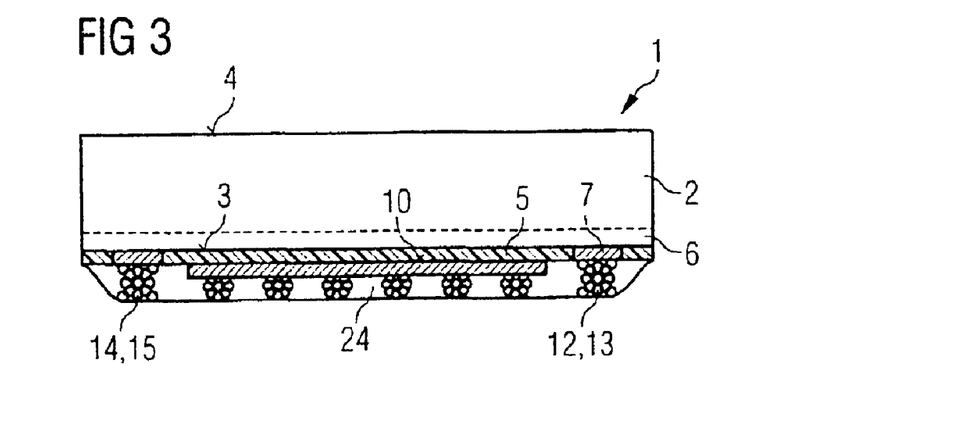
FIG. 3 is a sectional view through a third embodiment of a radio-frequency power component.

FIG. 3 shows a schematic cross section through a third embodiment of a radio-frequency power component 1 according to the invention. Components with the same functions as in the preceding figures are identified by the same reference symbols and will not be explained additionally.

The third embodiment of the invention differs from the preceding embodiments of the invention in that an adhesive layer is applied to the active upper face of the semiconductor chip 2 instead of discrete external contacts 30, as shown in FIG. 2, and instead of large-area thermally conductive contacts 33, as shown in FIG. 2. The special feature of this adhesive layer 24 is that it is anisotropic in terms of electrical conduction and thermal conduction. This anisotropy is based on electrically conductive and thermally conductive nanoparticles. The particles accumulate within a plastic base compound to form particle groups. The particles of the adhesive layer 24, when applied to the active upper face of the semiconductor chip, firstly form a number of thermally conductive points, that are isolated from one another, in the area of the macroscopically large heat-dissipating metal layer 11, and form electrically conductive particle accumulations, which are isolated in a corresponding manner from the thermally conductive points, on the microscopically small contact surfaces 7. In this embodiment, gold, copper, silver or aluminum particles or mixtures of them are used as the nanoparticles. The use of a thermoplastic base compound for the adhesive 24 allows this radio-frequency power component to be mounted on a circuit mount at any time by heating, while at the same time producing an electrical connection between the contact surfaces 7 of the semiconductor chip and the corresponding contact connecting surfaces on the circuit mount.

Figure 4:
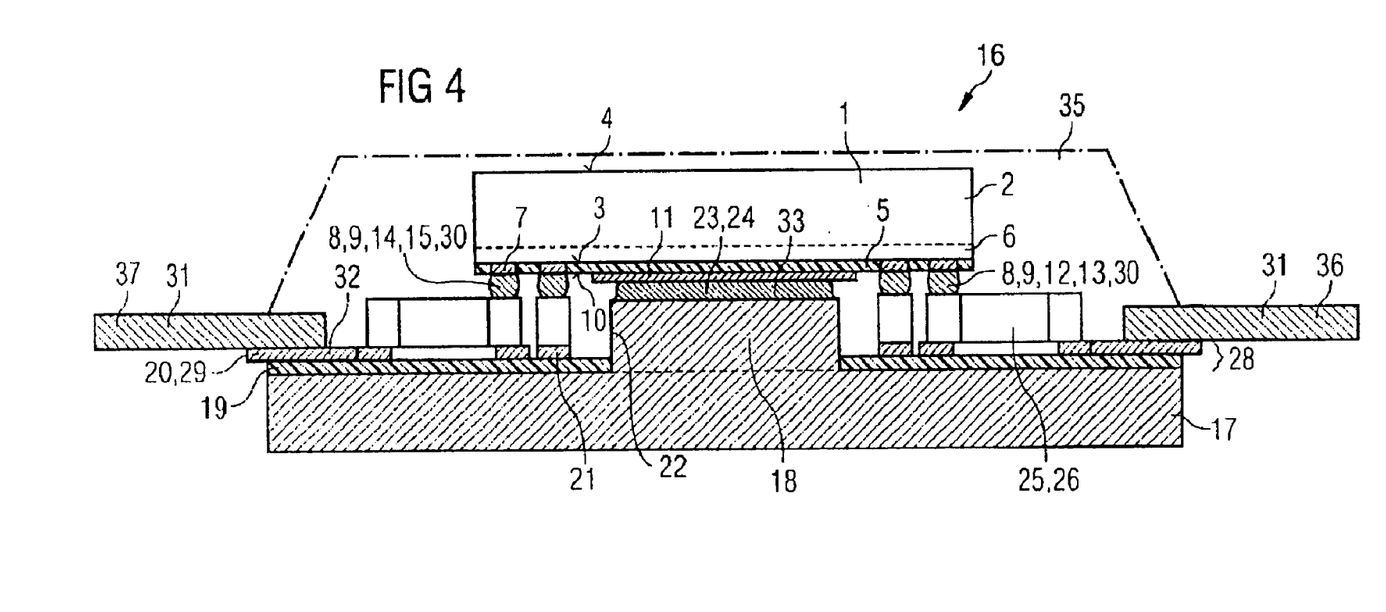
FIG. 4 is a sectional view of a radio-frequency power module with discrete passive components.

FIG. 4 shows a schematic cross section through a radio-frequency power module 16 with discrete passive components 25. Components with the same functions as in the preceding figures are identified by the same reference symbols and will not be explained additionally.

The reference symbol 17 denotes a cooling plate, which is at the same time used as a circuit mount or system mount. The reference symbol 18 denotes a cold cap. The cold cap 18 is disposed centrally on the cooling plate 17 in this embodiment of the invention. The surface size of the cold cap matches the macroscopic size of the heat-dissipating metal layer 11 of the radio-frequency power component 1. The reference symbol 19 denotes an isolation layer, which is disposed on the cooling plate 17 and surrounds the cold cup 18. The reference symbol 20 denotes a conductor track plane, which is disposed on the isolation layer 19 and has contact surfaces 21 which, in this embodiment of the invention, are connected via external contacts 30 to the contact surfaces of the radio-frequency power component 1. The conductor track plane 20 furthermore has contact connecting surfaces 21, which are connected to electrodes of passive discrete surface-mounted components 26, which are used for impedance matching of the input electrode 13 of the radio-frequency power component 1 and/or for impedance matching of the output electrode 15 of the radio-frequency power component 1. In this embodiment, coils for impedance matching are mounted both on the input side 36 and on the output side 37, as discrete components 25.

The active upper face 3 together with the active semiconductor structures 6 are intensively cooled via the heat-dissipating metal layer 11 and a solder layer 23, as well as the cold cap 18 to the cooling plate 17. An intensively cooled radio-frequency power module 16 such as this allows more power to be lost from the sensitive MOS field-effective transistors that are connected in parallel.

The reference symbol 31 denotes external flat conductors, which are connected via corresponding contact connecting surfaces of the conductor track structure 29 to the connecting electrodes of the discrete components 25. The radio-frequency power module 16 can be packed in a plastic packing compound 35, from the bottom area of which the cooling plate 17 projects, so that the active upper face of the radio-frequency power component 1 can be cooled directly via the cooling plate and the cold cap.

Figure 5:
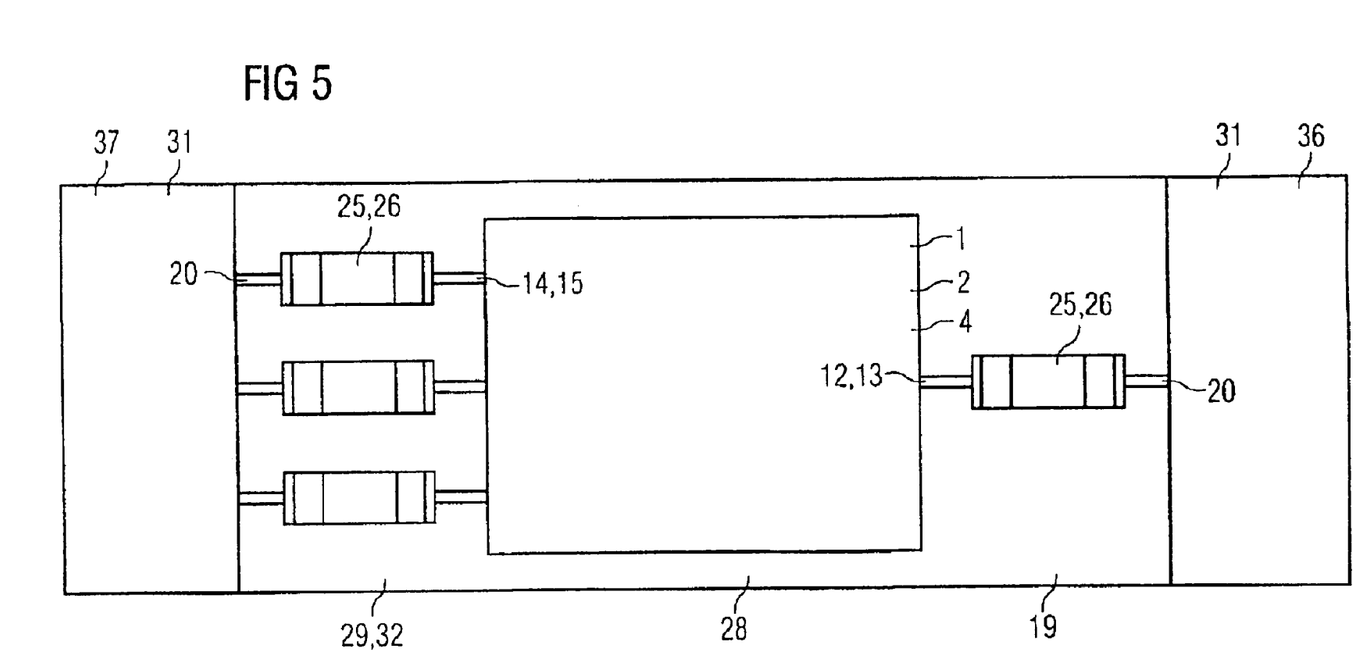
FIG. 5 is a plan view showing a radio-frequency power module as shown in FIG. 4.

FIG. 5 shows a schematic plan view of a radio-frequency power module 16 as shown in FIG. 4. Components with the same functions as in the preceding figures are identified by the same reference symbols and will not be explained additionally.

In this embodiment, large area flat conductors 31, which are connected to the conductor track plane 20, are disposed in each case on the right and left edge areas of the radio-frequency power module 16. The plan view shown in FIG. 5 shows the radio-frequency power module 16 without a plastic packing compound, as is indicated in FIG. 4 by the reference symbol 35 and a dashed line. A coil is configured as a discrete component 25 on the input side 36, for input impedance matching, and connects the flat conductor 31 on the input side 36 to the input electrode 13 of the radio-frequency power component 1. The radio-frequency power component is disposed in the center of the radio-frequency power module and, on its output side 3, has output electrodes 15 which are each connected via an output coil for impedance matching to the outer flat conductor 31 on the output side 37. The conductor track plane 20 is electrically isolated with its conductor track structure 29 from the cooling plate, which cannot be seen in this plan view, via the isolation layer 19.

Figure 6:
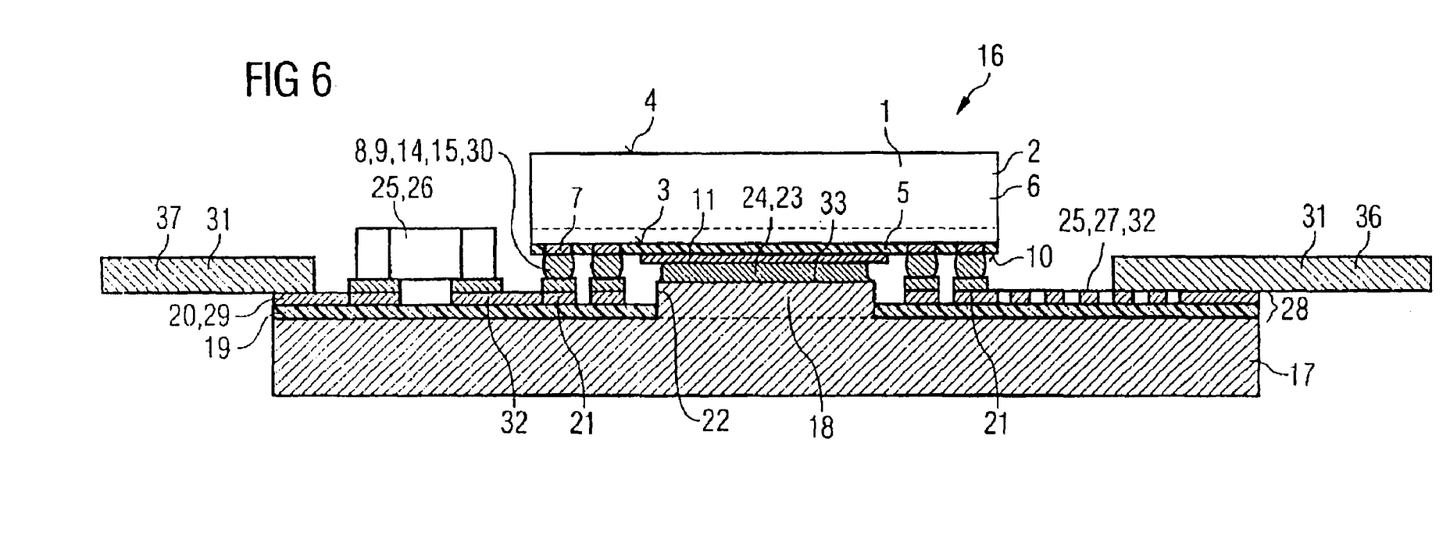
FIG. 6 is a sectional view through a radio-frequency power module with a printed passive component.

FIG. 6 shows a schematic cross section through a radio-frequency power module 16 with a printed passive component 27 on the input side 36. Components with the same functions as in the preceding figures are identified by the same reference symbols and will not be explained additionally.

While, on the input side 36, the flat conductor 31 is connected to a printed passive component 27 for impedance matching of the input of the radio-frequency power component 1, the flat conductor 31 is connected on the output side via discrete surface-mounted passive components 26 to the output of the radio-frequency power component 1. Furthermore, the embodiment shown in FIG. 6 differs from the embodiment shown in FIG. 5 in that the isolation layer 19 together with the conductor track plane 20 form a printed circuit board 28, which has an opening 22, through which, the cold cap 18 on the cooling plate 17 projects. A radio-frequency power module 16 constructed in this way has the advantage that passive printed electronic components that are used for impedance matching can be manufactured on the printed circuit board. The printed circuit board 28 cannot be aligned on the cooling plate 17 until it has been completed, so that the opening 22 in the printed circuit board 28 can be aligned in an interlocking manner with respect to the cold cap 18. For this purpose, the contour of the opening 22 and the contour of the cap 18 are matched to one another such that, during assembly, the printed circuit board 28 is automatically aligned correctly. In this embodiment as well, as shown in FIG. 6, the radio-frequency power component 1 is mounted on the circuit mount or system mount 40 with the cooling plate 17 using flip chip mounting.

Figure 7:
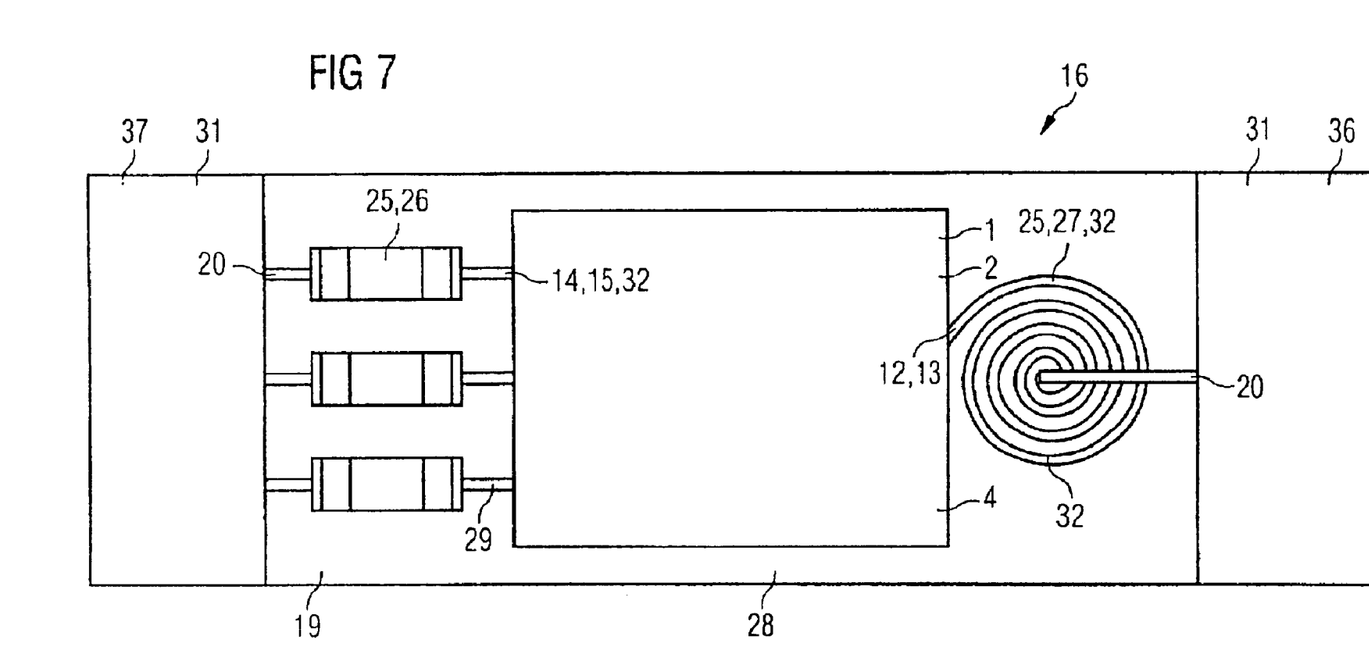
FIG. 7 is a plan view of a radio-frequency power module as shown in FIG. 6.

FIG. 7 shows a schematic plan view of a radio-frequency power module 16 as shown in FIG. 6. Components with the same functions as in the preceding figures are identified by the same reference symbols and will not be explained additionally.

The printed component 27 on the input side 36 essentially includes a spiral shaped conductor track 32 that is used as an inductance for impedance matching of the input of the radio-frequency power module 16. The output side 37 is configured in the same way as in the embodiment shown in FIG. 4. In this plan view as well, the plastic packing compound in which the radio-frequency power module 16 is packed has been omitted, so that the passive rear face 4 of the semiconductor chip 2 can be seen in the center of the radio-frequency power module 16.

FIGS. 8 to 15 show, schematically and in the form of a cross section, results of method steps for producing a number of radio-frequency power components 1. Components with the same function as in the preceding figures are identified by the same reference symbols and will not be explained additionally.

Figure 8:
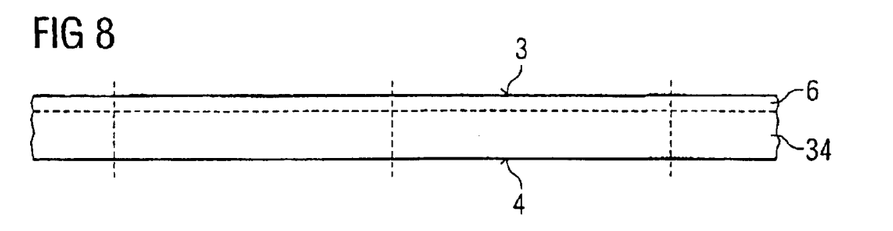
FIGS. 8 to 15 are sectional views showing method steps for producing a number of radio-frequency power components.

FIG. 8 shows a schematic cross section of a semiconductor wafer 34 for the parallel production of a number of radio-frequency power components. The semiconductor wafer 34 has an upper face 3 and a rear face 4. The semiconductor wafer itself is composed of a monocrystalline silicon and, in the area of its upper face 3, has active semiconductor structures 6 that essentially include radio-frequency power transistors and radio-frequency power diodes. The area for these semiconductor structures 6 is identified by a dashed line parallel to the upper face 3 in the illustrated schematic cross section. The dashed lines, which are configured transversely with respect to the upper face 3 and with respect to the rear face 4, are intended to show the boundaries for the individual radio-frequency power components. The wafer can be separated into semiconductor chips by sawing along these dashed lines. The thickness of the semiconductor wafer 34 is between 350 and 750 micrometers. The thickness of the active semiconductor structures is in the region of a few micrometers. In this embodiment of the invention, the active semiconductor structures include a large number of MOS field-effect transistors which are connected in parallel. The gate electrodes of these field-effect transistors are combined to form an input electrode, while the drain connections are combined to form an output electrode.

Figure 9:
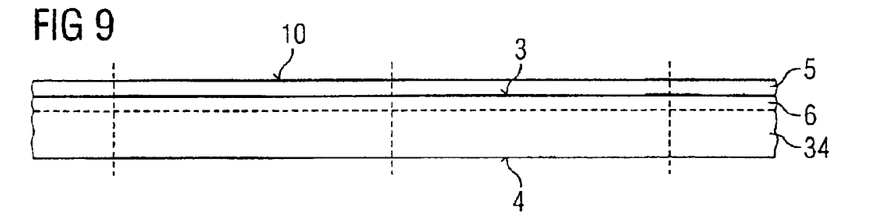

FIG. 9 shows a schematic cross section of a semiconductor wafer 34 with a passivating and isolating layer 5 on the active upper face of the semiconductor wafer 34. This passivating and isolating layer 5 is intended to protect and to isolate the active semiconductor structures 6. As is shown in FIG. 9, it can first of all be applied as a closed protective layer to the semiconductor wafer 34.

Figure 10:
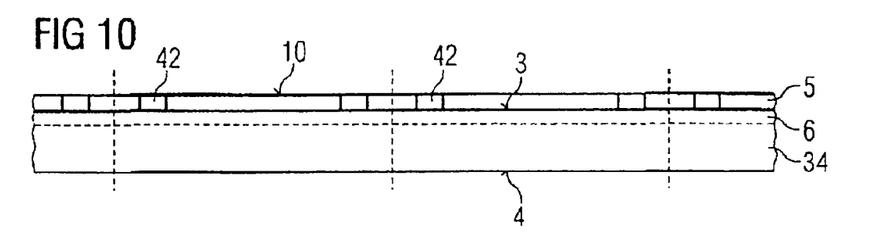

FIG. 10 shows a schematic cross section of a semiconductor wafer 34 with exposed areas 42 for contact surfaces. In contrast to the illustration shown here in FIG. 10, such contact surfaces may be microscopically small, that is to say they can be identified and measured only using an optical microscope. In contrast to them, the remaining structured electrically isolating layer 5 is of a macroscopic size, that is to say it can be identified and measured with the naked eye.

Figure 11:
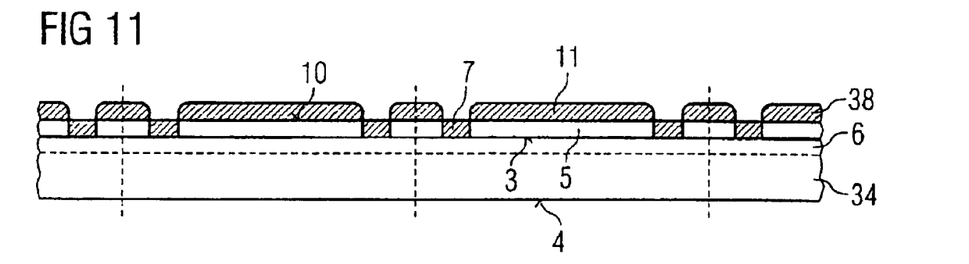

FIG. 11 shows a schematic cross section of a semiconductor wafer 34 with a closed metal layer 38 that, on the one hand, fills the exposed areas 42 for the contact surfaces and, on the other hand, covers the surface of the semiconductor wafer 34 so that it is closed. This metal layer may have copper, gold, silver, aluminum or alloys of them. It is used to produce simultaneously contact surfaces 7 and a heat-dissipating metal layer on the electrically isolating layer 5. While the contact surfaces 7 are connected to the active semiconductor structures 6 via conductor tracks, the metal layer 11 is electrically isolated from the active semiconductor structures 6 by the electrically isolating layer 5.

Figure 12:
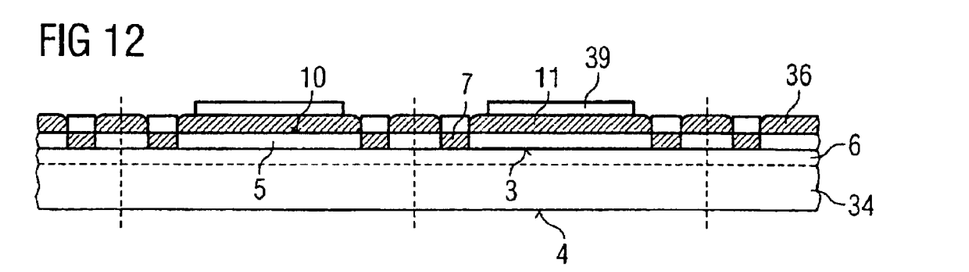

FIG. 12 shows a schematic cross section of a semiconductor wafer 34 with a structured photoresist layer 39 on the closed metal layer 38. The structured photoresist layer protects the areas of the contact surfaces and of the heat-dissipated metal layer 11 against being etched away during the next step. The etching of the exposed metal areas results in a semiconductor wafer 34 that can be separated into individual radio-frequency power components along the dashed line transversely with respect to the thickness of the semiconductor wafer.

Figure 13:
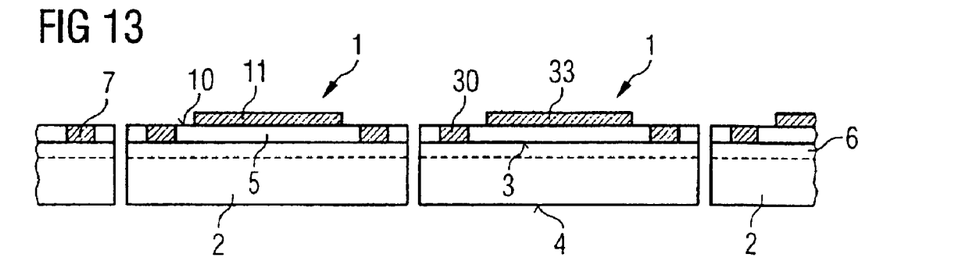

FIG. 13 shows a schematic cross section of a number of radio-frequency power components 1 after structuring of the closed metal layer 38 in FIG. 12 into metallic contact surfaces 7 and a heat-dissipating metal layer 11 for each radio-frequency power component 1, and after removal of the structured photoresist layer 39 in FIG. 12, as well as after separation of the semiconductor wafer 34 into a number of radio-frequency power components 1. The production method for a number of radio-frequency power components 1, as is illustrated in FIGS. 8 to 13, has the advantage that this is a parallel production method in which a number of radio-frequency power components 1 can be produced at the same time. Furthermore, it is possible with only one metallization step to simultaneously produce the microscopically small contact surfaces 7 as external contacts 30 with a large heat-dissipating metal layer 11, which can be used as the thermally conductive contact 33.

Figure 14:
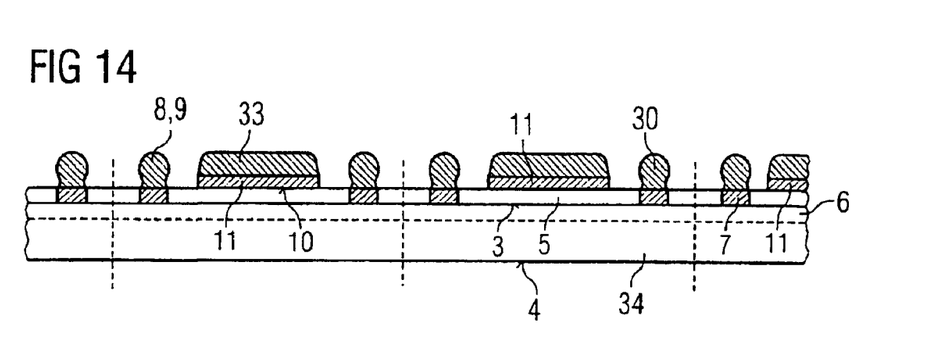

FIG. 14 shows a schematic cross section through a semiconductor wafer 34 that has external contacts 30 on the contact surfaces 7 and has a thermally conductive contact 33 for each radio-frequency power component on the thermally conductive metal layer 11. The external contacts 30, which are produced in the form of microscopically small solder balls 9 or solder studs 8, and the thermally conductive contact 33 can be produced at the same time in one step on the entire surface of the semiconductor wafer 34 for a number of radio-frequency power components, and the semiconductor wafer can then be separated into individual radio-frequency power components.

Figure 15:
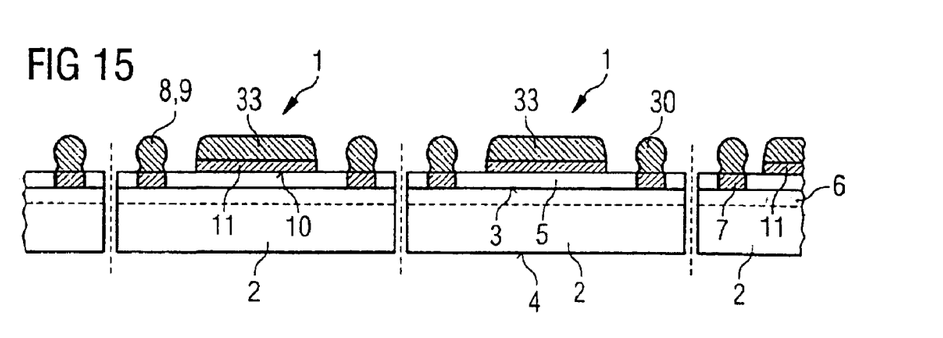

FIG. 15 shows a schematic cross section for a number of radio-frequency power components 1 after the semiconductor wafer 34 in FIG. 14 has been separated into individual semiconductor chips 2. The radio-frequency power component 1 in FIG. 15, which is produced in this way, corresponds to the radio-frequency power component 1 in the second embodiment of the invention, as is illustrated in FIG. 2. The radio-frequency power component 1, which is produced by method steps 8 to 13, corresponds to the first embodiment of the invention, as is illustrated in FIG. 1.

During the production of radio-frequency power components in accordance with the third embodiment of the invention, as is illustrated in FIG. 3, the entire semiconductor wafer or individual radio-frequency power components are coated on the surface of the semiconductor wafer 34, after the structuring of the metal layer 38 in FIG. 12, with a thermoplastic adhesive. The thermoplastic layer has a high filling level in the range from 60 to 95% by weight of electrically conductive nanoparticles. This adhesive with its electrically conductive nanoparticles has the characteristic that these nanoparticles accumulate to form spherical accumulations within the thermoplastic layer and thus have anisotropic electrical conductivity when the thermoplastic adhesive is applied to a surface. This can be used for the purpose of allowing the adhesive for electrical connection of the radio-frequency power component 1 to be connected to a higher-order circuit mount without the adhesive layer needing to be structured.

FIGS. 16 to 23 show schematically, in the form of a cross section, results of production steps for producing a number of radio-frequency power modules 16. Components with the same functions as in the preceding figures are identified by the same reference symbols and will not be explained additionally.

Figure 16:
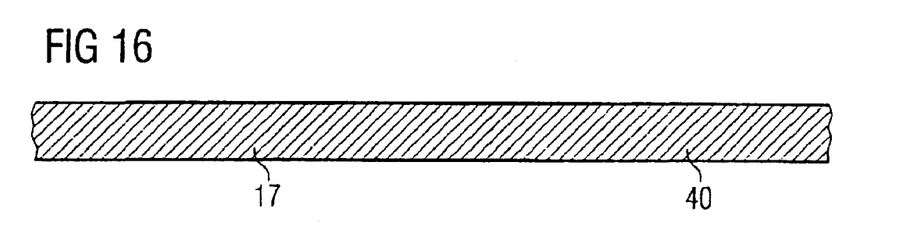
FIGS. 16 to 23 are sectional views showing the method steps for producing a number of radio-frequency power modules.

FIG. 16 shows a schematic cross section through a circuit or system mount 40 for producing a number of radio-frequency power modules. In addition to a radio-frequency power component, a radio-frequency power module has further passive components that are used essentially for impedance matching of the input and output of the radio-frequency power module. In order to produce such a radio-frequency power module, a circuit mount or system mount 40 is first of all provided in the form of a cooling plate 17 composed of metal. This metal may have a copper alloy or a stainless iron alloy. The system mount 40 may be dimensioned such that it is used for parallel production of a number of radio-frequency power modules. A mask formed from a structured passivation layer 41 is first of all applied to the system mount 40.

Figure 17:
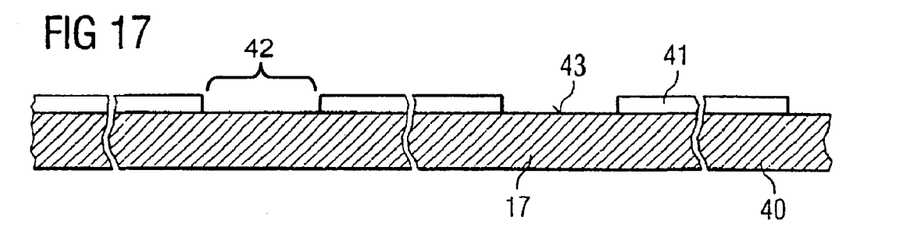

FIG. 17 shows a schematic cross section through the system mount 40 with a structured passivation layer 41. The structured passivation layer is used to ensure that a metal can be electrochemically deposited only in the exposed areas of the system mount and of the cooling plate 17.

Figure 18:
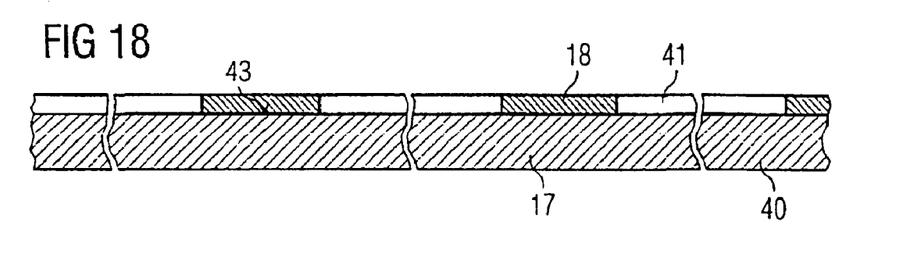

FIG. 18 shows a schematic cross section through a system mount 40 after a number of cold caps 18 have been fitted to the system mount 40 for a number of radio-frequency power modules. These cold caps 18 are produced by electrochemical deposition in this embodiment of the invention, in which case cold caps 18 such as these can be electrochemically deposited in the openings 42 of the structured passivation layer 41, as is shown in FIG. 17. The passivation layer around the cap 18 ensures that no metal grows electrochemically in these areas.

Figure 19:
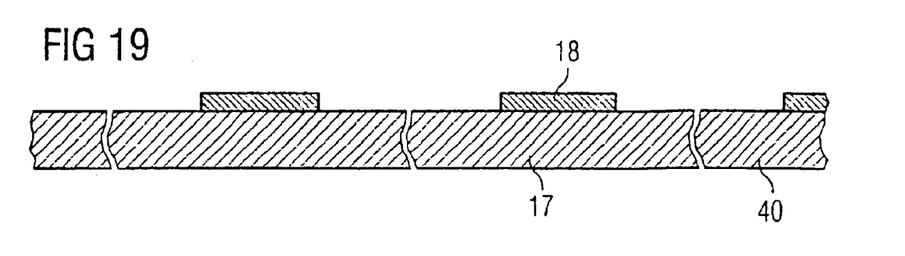

FIG. 19 shows a schematic cross section through a system mount 40 after removal of the structured passivation layer 41, which is shown in FIG. 17. This production step results in a system mount 40 or a circuit mount in the form of a cooling plate 17 with cold caps 18 on which an isolation layer with a conductor track plane can be deposited. However, in the present production method, a printed circuit board is prepared separately from the production of this circuit or system mount 40, with the printed circuit board having openings that correspond to the size of the cold caps 18. The size of the cold caps 18 themselves once again correspond to the size of the thermally conductive contact of a radio-frequency power component or to the size of the heat-dissipating metal layer of this radio-frequency power component.

Figure 20:
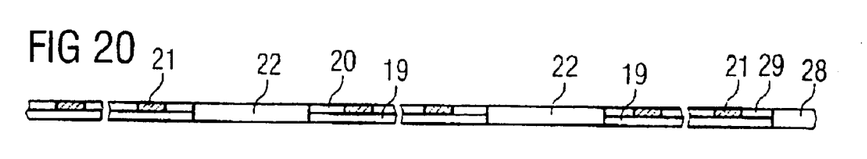

FIG. 20 shows a cross section through a corresponding printed circuit board 28, which has an opening 22 whose external contour is matched to the contour of the cold cap. The contour may be structured such that an interlocking coding is provided for the alignment of the printed circuit board 28 on the system mount. The printed circuit board 28 has an isolation layer 19 on which a conductor track plane 20 is disposed. In addition to conductor tracks, this conductor track plane 20 also has printed passive components for matching the impedance of the radio-frequency power module. Furthermore, the conductor track plane 20 has contact connecting surfaces 21, whose size and configuration correspond to the microscopically small contact surfaces of the semiconductor chip of a radio-frequency power component. A printed circuit board 28 prepared in this way with a number of openings 22 for a number of heat sinks of a system mount can be placed directly on the system mount. Adhesives may be used for this placement process, in order to fix the printed circuit board 28 on the system mount.

Figure 21:
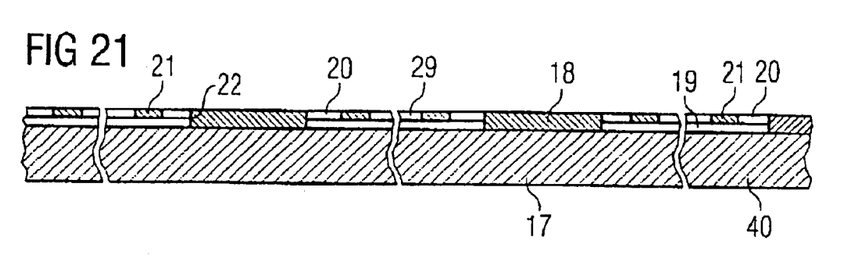

FIG. 21 shows a schematic cross section through a system mount 40 after the printed circuit board 28, which is shown in FIG. 20, has been fitted. A structure such as this, as is shown in FIG. 21, can also be produced by applying an isolation layer to the cooling plate 17, or to the system mount 40, leaving free the cold caps 18. After this, a conductor track structure 29 with printed passive components for impedance matching of the input and/or of the output of a radio-frequency power module and/or with contact connecting surfaces 21 for mounting of a radio-frequency power component using a flip chip technique is applied to the conductor track plane 20.

Figure 22:
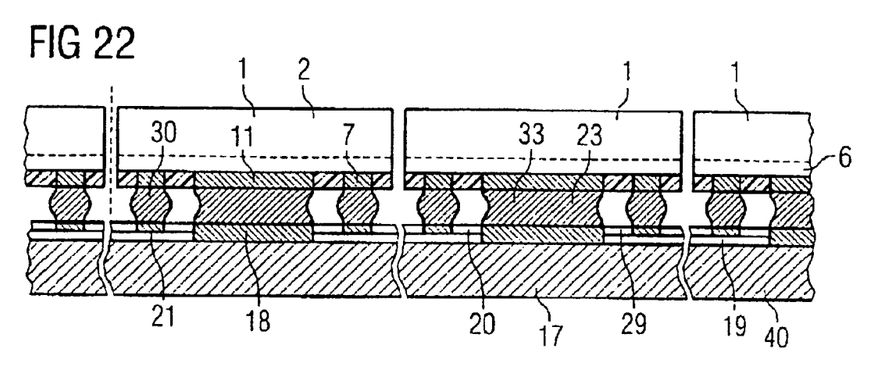

FIG. 22 shows a schematic cross section through a system mount 40 after the radio-frequency power components 1 have been fitted to the system mount 40, using a flip chip technique. In the process, the thermally conductive contact 33 is firstly thermally conductively connected to the cold cap while, at the same time, external contacts 30 can be connected to the contact connecting surfaces 21 on the system mount 40. Instead of the technique that makes use of external contacts 30 and a large-area thermally conductive contact 33, an adhesive technique may also be used, which makes use of a thermoplastic adhesive and electrically anisotropically conductive nanoparticles. If only the thermally conductive connection between the heat-dissipating layer 11 and the cold cap 18 is thermally conductively connected with the aid of a filled adhesive, then the particles which are used may also be thermally conductive particles while nevertheless having an electrically isolating effect, such as silicon dioxide particles, boron nitride particles, aluminum nitride particles or mixtures of them. Particles such as these have the advantage that, although they produce a thermal connection, they produce electrically small short-circuits, however.

Figure 23:
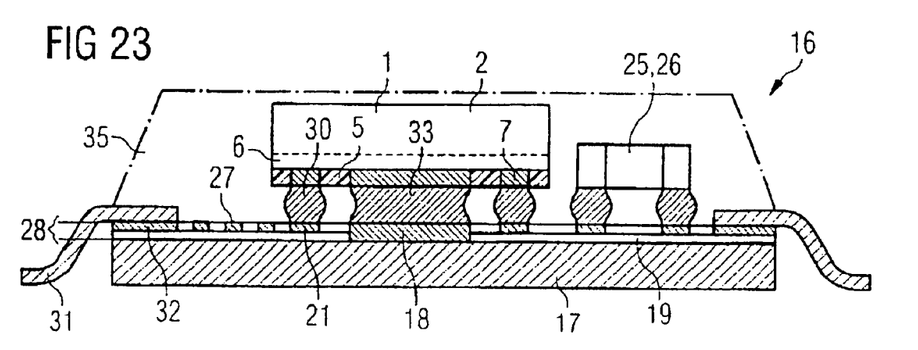

FIG. 23 shows a schematic cross section through a radio-frequency power module 16 after the passive components 25 have been fitted to the printed circuit board 28. For impedance matching of the input and output of the radio-frequency power module 16, passive components 25 in the form of discrete components 26 are fitted as surface-mounted components to the system mount 40, in the form of a cooling plate 17, before and after the fitting of the radio-frequency power component 1, and, finally, external flat conductors 31 are connected to the conductor track plane 20. For this purpose, the conductor track plane may be equipped with printed passive components, which are likewise used for impedance matching. Finally, the components of the radio-frequency power module 16 may be protected by a plastic packing compound 35 by spraying or pressing on a plastic packing compound 35. Another option for protecting the components of the radio-frequency power component against mechanical loads is to place a pack cap over the components of the radio-frequency power component.

We claim:

1. A radio-frequency power component, comprising:
    a semiconductor chip for flip chip mounting, said semiconductor chip having an active upper face producing power losses and a passive rear face, said upper face having active semiconductor structures and an electrically isolating layer with an upper surface and covering said active semiconductor structures and leaving free contact surfaces with external contacts configured in a defined grid size, and
    said semiconductor chip having a heat-dissipating metal layer disposed on said upper surface of said isolating layer and being electrically isolated front said active semiconductor structures, said heat-dissipating metal layer to be fixedly attached to a heat sink.

2. The radio-frequency power component according to claim 1, wherein:

said active semiconductor structures producing the power losses on said active upper face of said semiconductor chip have a plurality of parallel-connected metal oxide field-effect transistors having a common gate contact forming an input electrode and a common drain contact forming an output electrode; and said heat-dissipating metal layer covers and electrically isolates each of said plurality of metal oxide field-effect transistors.

3. A radio-frequency power module, comprising:

a radio-frequency power component including:
　a semiconductor chip for flip chip mounting, said semiconductor chip having an active upper face producing power losses and a passive rear face, said upper face having active semiconductor structures and an electrically isolating layer with an upper surface and covering said active semiconductor structures and leaving free contact surfaces with external contacts configured in a defined grid size; and
　a heat-dissipating metal layer disposed on said upper surface of said isolating layer and being electrically isolated from said active semiconductor structures;

a cooling plate supporting said radio-frequency power component and having a cold cap and an isolation layer, said isolation layer surrounding said cold cap and having a conductor track plane, a size of an upper face of said cold cap equaling said grid size of said matching a size of said heat-dissipating metal layer of said radio-frequency power component; and contact connecting surfaces disposed on said conductor track plane and interconnecting said radio-frequency power component and said cooling plate using flip chip technology, said contact connecting surfaces having a grid size equaling said grid size of said contact surfaces of said radio-frequency power component.

4. The radio-frequency power module according to claim 3, wherein:

said isolation layer with a conductor track plane is a printed circuit board;

said printed circuit board has an opening therein matching said cold cap on said cooling plate; and said cold cap projecting through said opening in said printed circuit board and being thermally connected to said heat-dissipating metal layer of said radio-frequency power component.

5. The radio-frequency power module according to claim 3, further comprising a thermally conductive solder layer disposed between said heat-dissipating metal layer and said cold cap and acting as a large-area thermally conductive contact.

6. The radio-frequency power module according to claim 3, further comprising a thermally conductive adhesive layer with thermally conductive particles disposed between said heat-dissipating metal layer and said cold cap.

7. The radio-frequency power module according to claim 6, wherein said the thermally conductive particles include materials selected from the group consisting of aluminum, copper, silver, gold, silicon oxide, boron nitride, and aluminum nitride.

8. The radio-frequency power module according to claim 3, further comprising passive discrete components for impedance matching to at least one of an input and an output of said radio-frequency power component.

9. The radio-frequency power module according to claim 3, further comprising passive surface-mounted components for impedance matching to at least one of an input and an output of said radio-frequency power component.

10. The radio-frequency power module according to claim 3, further comprising passive printed components for impedance matching to at least one of an input and an output of said radio-frequency power component.

* * * * *